(12) United States Patent
Bergmann

(10) Patent No.: US 6,207,029 B1
(45) Date of Patent: *Mar. 27, 2001

(54) APPARATUS FOR VAPOR DEPOSITION AND EVAPORATOR

(76) Inventor: Erich Bergmann, Klingnaustrasse 3, CH-4058 Basel (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/679,386

(22) Filed: Jul. 9, 1996

(30) Foreign Application Priority Data

Jul. 11, 1995 (CH) .................................. 02 073/95

(51) Int. Cl.$^7$ .................................................. C23C 14/24
(52) U.S. Cl. ........................ 204/298.41; 204/192.38; 118/723 VE
(58) Field of Search ................. 204/192.38, 298.41, 204/298.19, 298.2; 118/723 VE

(56) References Cited

U.S. PATENT DOCUMENTS

| | | | |
|---|---|---|---|
| 3,625,848 | * 12/1971 | Snaper | 204/192.38 |
| 3,793,179 | 2/1974 | Sablev et al. | 204/298.41 |
| 4,448,659 | 5/1984 | Morrison, Jr. | 204/192.38 |
| 4,556,471 | * 12/1985 | Bergmann et al. | 204/298.41 |
| 4,622,452 | 11/1986 | Bergmann et al. | 219/121.52 |
| 4,673,477 | 6/1987 | Ramalingam et al. | 204/192.38 |
| 4,724,058 | 2/1988 | Morrison, Jr. | 204/192.38 |
| 4,839,011 | * 6/1989 | Ramalingam et al. | 204/298.41 |
| 4,872,964 | * 10/1989 | Suzuki et al. | 204/298.2 |
| 4,877,505 | 10/1989 | Bergmann | 204/192.38 |
| 4,929,322 | * 5/1990 | Sue et al. | 204/298.41 |
| 5,126,030 | * 6/1992 | Tamagaki et al. | 204/298.41 |
| 5,282,944 | 2/1994 | Sanders et al. | 204/192.38 |
| 5,317,235 | 5/1994 | Treglio | 315/111.41 |
| 5,363,400 | * 11/1994 | Damond et al. | 204/298.41 |

FOREIGN PATENT DOCUMENTS

| | | |
|---|---|---|
| 39 36 550 | 4/1991 | (DE) . |
| 41 09 213 | 4/1992 | (DE) . |
| 41 25 365 | 5/1992 | (DE) . |
| 104998 | 7/1998 | (DE) . |
| 126040 | 5/2000 | (DE) . |
| 0 283 095 | 9/1988 | (EP) . |
| 0 492 592 | 7/1992 | (EP) . |
| 0 508 612 | 10/1992 | (EP) . |
| 0 511 153 | 10/1992 | (EP) . |
| 0 548 032 | 6/1993 | (EP) . |
| 368 807 | * 7/1978 | (RU) ................ 204/298.41 |

OTHER PUBLICATIONS

Daalder, "Components of cathode erosion in vacuum arcs", D:Appl. Phys., vol. 9, 1976.

Moll et al., "Hard Coatings by Plasma-Assisted PVD Technologies: Industrial Practice", Surface and Coatings Technology, 37 (1989) 483–509.

* cited by examiner

Primary Examiner—Rodney McDonald
(74) Attorney, Agent, or Firm—Larson & Taylor, PLC

(57) ABSTRACT

The invention concerns an apparatus for the plasma assisted physical vapor deposition of coatings onto workpieces and a cathode spot arc evaporator and the form of integration of the evaporator in the coating apparatus.

11 Claims, 6 Drawing Sheets

APPARATUS FOR VAPOR DEPOSITION AND EVAPORATOR

FIELD OF THE INVENTION

The object of the invention is an apparatus for the plasma assisted vapor coating of workpieces under vacuum, an evaporator using the principle of arc evaporation and a novel form of integrating such an evaporator into an apparatus for vapor deposition.

BACKGROUND OF THE INVENTION

Many methods for the plasma assisted physical vapor deposition have been proposed over the last 30 years and in the meantime many of them have found widespread application ( see E. Bergmann and E. Moll: plasma assisted PVD coating technologies published in Surface Coatings and Technologies, volume 37, pages 483 ff. (1989)).

Any physical vapor deposition can be viewed as a succession of three process steps, each of them stationary: Evaporation of components of the material, that will form the coating in a suitable installation called evaporator, transport of these components and eventually further gaseous components to the workpieces under molecular flow conditions or with electrostatic or electromagnetic flow management, transformation of these components into a coating with the required properties on the workpiece surfaces. Several realizations of evaporators are known and are currently in use ( see E. Bergmann and E. Moll op. cit.). In the case of physical vapor deposition of wear resistant coatings onto workpieces these realizations are either based on sputtering or on arc evaporation. ff the deposition process comprises a chemical reaction with other coating constituents brought into the coating chamber in the form of gases, the deposition is called a reactive deposition. If the coating is constituted exclusively from the material evaporated from the evaporator, the process is called a non-reactive deposition. This invention concerns both types of deposition processes.

If an arc is used for the evaporation in the evaporator, there exist the possibilities of evaporating the material on the cathode or on the anode of the arc. Since in the first case the arc connects to the cathodes only via one or several small spots, whose extension is negligible with respect to the cathode surface, one calls this process cathode spot arc evaporation. Many papers and patents describing this process have been published, since L. P. Sablev, N. P. Atamanskij, V. N. Gorbunov, J. I. Dolotow, J. I. Luzenko, V. M. Lunev and V. V. Usov showed in U.S. Pat. No. 3793179, how this phenomenon can be used for physical vapor deposition. This invention concerns an apparatus for cathode spot arc evaporation.

The practical use of the method of cathode spot arc evaporation is plagued with three problems, for which numerous remedies have been proposed over the past twenty years:

The stability problem: the stability of the arc discharge and the confinement of the spot location onto the section of the cathode surface provided for the evaporation called the target.

The droplet problem: the phase distribution of the material transported from the cathode to the workpieces, consisting mainly of atoms, ions and microdroplets.

The erosion uniformity problem: The uniformity of the target erosion. Already in U.S. Pat. No. 3793179 it was proposed to use protection shields and magnetic fields to solve the stability problem. Several further detailed embodiments that claim to solve the stability problem have since been proposed. The last is M. Belletti who proposed in EP 548032 A2 to use the magnetic field induced by the current leads. Belletti's patent contains a detailed discussion of the state of the art with respect to protection shields. The magnetic fields used are always of such shape, that the region, where the projection of the field vector onto the target surface has a relative maximum forms a closed loop. This principle was proposed by C.F. Morrison jr. in the U.S. Pat. No. 4448659. It has since been de-ailed and carried further to include magnetic fields, that vary over time or to magnetic fields that are rotationally symmetric fields rotating around an axis, that is not the axis of symmetry like in DE 4109213.

The material emitted from the cathode spot consists of atoms, ions and microdroplets. This material combined with the electrons is called the plasma beam. The distribution of the different components of the plasma beam is angle dependent. This was shown in an investigation by J. E. Daalder, that has appeared in 1976 in volume 9 of the Journal of physics D on pages 2379–2395. An important fraction of micro-deoplets in the coating formed on the workpiece makes the coating unsuited for use least decreases its performance drastically. At its origin the fractions of the different phases of the plasma beam depend on the frequency with which the cathode spots change their position on the target surface. The fraction of micro-droplets decreases with increasing frequency. Since the large electrical current leaving the cathode can be moved straightforwardly with Lorenz forces, one uses magnetic fields, with a strong vector component parallel to the target surface to channel the cathode spots into a narrow track thereby reducing the fraction of micro-droplets. This method and a corresponding embodiment was first proposed by S. Ramalingam and K. Kim in U.S. Pat. No. 4673477.

A second method of micro-droplet reduction uses deflections of the plasma beam. This method is called filtered cathode spot arc deposition. Two recent propositions for an embodiment of this method came from D. M. Sanders and S. Falabella: U.S. Pat. No. 5282944 and from N. Matentzoglu, G. Schurracher and J. Becker: DE 4125365. Matentzoglu et al. propose to insert a shield between the target surface and the workpieces. The ions are deflected electrostatically around the shield, while micro-deoplets will hit the shield and be thereby retained. U.S. Pat. No. 5282944 uses a ring shaped target (17'), housed in an annex chamber. The plasma beam is deflected by 90° before it reaches the main chamber, where it will be deflected once more by 90° before it reaches the workpieces (27'). The evaporator and its incorporation into the coating chamber are executed in a way, that only ions can go all the way from the target surface to the workpiece surfaces.

A third method uses an electromagnetic ionization enhancement, that ionizes the atoms and to a limited extent also the micro-droplets during the transport from the target to the workpieces. This method and a corresponding embodiment was proposed by P. E. Sathrum and B.F. Coll in EP 511153. The best method and embodiment of the state of the art combines the third and the second method. It was proposed by J. R. Treglio in U.S. Pat. No. 5317235. The cathode spot arc evaporator is realized as an annex chamber (20"). The annex chamber is linked to the main chamber by a small orifice (32"). The target surface is ring shaped and in a position, that all components must be deflected at least once in order to reach the workpieces. The deflection is provoked by a coil magnet (30").

There exist also many proposed methods and embodiments to solve the uniformity problem. They all consist in essence of electrostatic and electromagnetic means to steer the cathode spot. The electrostatic methods were invented by H. Tamagaki in EP 492592. Because of they do not yield the desired result, we will not discuss them in any detail. All magnetic embodiments further develop on the original proposition of U.S. Pat. No. 4724058 by introducing additional time modulated magnetic fields produced by coils or by moving the magnetic field in a double rotation. The state of the art is represented by H. Veltrop, B. Buil and S. Boelens in EP 283095 and by J. Reschke, W. Erbkamm. W. Nedon, R. Pochert. B. Scheffel, S. Schiller and H. Schmidt in DE 4109213.

The state of the art methods and apparatus for the solution of the 3 problems can not and do not satisfy the user of cathode spot arc evaporation, who wants to produce quality coatings at a price accepted by the market for several reasons. Not the least reason is the fact that each of the proposed embodiments and methods solves only one problem and is realized in a way, that it excludes the solution of the other problems by the means proposed for this purpose.

The embodiments for the solution of the stability problem use shields, that must be kept at an intermediate potential with respect to the cathode and anode potential. But shields at such a potential must be used in the filtered cathode spot arc deposition embodiments as guiding obstacles for the deflection of the plasma beam. Since nature accepts only one electric field at each point, shields can not on the one side enclose the cathode surfaces not facing the substrates and deflect precisely the plasma beam in the space between target and workpieces. The situation for the proposed magnetic fields is similar: To solve the stability problem U.S. Pat. No. 4673477 teaches to use magnetic fields "having portions generally parallel to the cathode" while the deflection methods require a magnetic field essentially normal to the surface. The embodiments proposed to solve the target uniformity problem also use magnetic fields, that are essentially parallel to the target surface over large portions of the target. These embodiments are therefore not compatible with filtered cathodic spot arc evaporation. Even the most skilled person can not solve this dilemma. The state of the art embodiments of filtered cathodic spot arc deposition have further severe disadvantages. A large fraction of the evaporated material that should form the coating does not reach the workpieces, typically 60–90%. This makes the embodiments double inefficient. More than half of the material, which is evaporated at great expense is wasted. More than half of the material which ought form the a precious coating sold for a good price must be removed from the shields and deflection devices at great expense. It is by no means simple for a man skilled in the art to remove thick wear and corrosion resistant hard coatings from sensitive components like coils. The above mentioned patents give no hint of how this could be achieved.

If one tries to use the state of the art methods of filtered cathode spot arc deposition or ionization enhanced cathodic spot arc deposition one discovers further unexpected disadvantages. Both embodiments do not only remove microdroplets from the plasma beam but also the atoms, either by filtering or by ionization. It turned out, that the use synthesis of coatings from material that consists only of ions has two disadvantages: The impinging ions sputter a fraction of the deposited coating. This fraction is lost. It amounts 30–80% of the deposited coating material. The method becomes even less efficient and still more expensive. The impinging ions introduce defects in the lattice of the deposited polycrystalline coating material. Defects have an important negative impact on the electrical and optical properties of the deposited coating An excess of defects is also damaging for the mechanical properties.

The state of the art embodiments for the solution of the target uniformity problem are not satisfactory in many respects. The coils needed to time modulate the magnetic fields are difficult to integrate in high vacuum equipment. This task is rendered even more difficult by the fact, that they must be insulated from the cathode body, which is connected to a power supply. In a concrete realization the currents required to produce sufficiently large magnetic fields need a cooling circuit for the coils. Since the water cooling circuit of the cathode can not be used, one has to integrate a second independent cooling circuit. Similar mechanical engineering problems arise with the proposed complicated doubly rotation movement. Of course all these problems of mechanical design can be solved by a man skilled in the art, but the effort is gigantic. Furthermore, the use of complicated mechanical devices in vacuum and under plasma in particular is always plagued with reliability problems. In addition both state of the art embodiments for the solution of the uniformity problem do not solve the brim problem. When a circular target is used a brim forms because the erosion on the border of the target is weaker than the erosion in the central section. The target surface becomes concave upon use. This brim formation is caused by the shape of the magnetic fields used in the state of the art. They all employ a surface with a field essentially parallel to the target enclosed by two pole zones. Since the magnets must move inside the cathode body, the border sections of the target are always scanned by pole zones. Therefore this border section becomes a section not accessed by the cathode spot. A satisfactory solution for the brim problem has not been found so far.

SUMMARY OF THE INVENTION

The invention solves these problems by a novel coating apparatus, a novel design of the evaporators and a particular way of integration of the evaporators in the coating apparatus.

The state of the art uses either evaporators that are contained in the coating chamber or evaporators fitted onto it by a vacuum flange. Some embodiments for the filtered cathode spot arc deposition use annex chambers. But these annex chambers are always constructed in a way which prevents line of sight contact from the target surface in the annex chamber to the work pieces in the coating chamber through the connecting orifice. This disposition is part of the principles underlying these embodiments. It leads to the problems already discussed. The apparatus which is the subject of this invention consists of a main chamber, which does not contain any evaporators or does not have any evaporators fitted onto it by a vacuum flange. The main chamber contains only the workpieces, there fixtures and if necessary means for conditioning and deconditioning the workpieces. The apparatus which is the subject of this invention consists furthermore of at least one side chamber. The side chamber contains the cathode spot arc evaporators and is linked to the main chamber by a big rectangular opening which does not impede the flow of the neutral vapor, that is the atoms of the evaporated material, that will form the coating to the workpieces. At low working pressures this flow will be molecular. The principle of unimpeded flow requires that the connection between main chamber and side chamber extends over a major portion of the chamber height. The height of the connection must exceed the coating height. The term coating height is used to designate the length of the cylinder generator of the space section, which contains all the workpiece surfaces, that ought to be coated. The relation between coating height and main chamber height depends of course on the variety of the workpieces to be coated. It also depends on the skill of the mechanical engineer designing the fixtures and the conditioning devices. An economic design should at least have 60% of the chamber height as the coating height. The depth of the side chamber is one of the characteristics of the apparatus that is the subject of this invention because determine the phase distribution of the material deposited. It turned out, that if the depth of the side chamber is below 300 mm, the fraction of micro-droplets impinging on the workpiece surfaces becomes so important, that the coating of ground cutting tools with titanium compounds undergoes a drop in quality. A side chamber depth of 300 mm is a sufficient for an apparatus used exclusively to coat ground cutting tools. But if one coats mainly polished or honed tools, an increase of the depth of the side chamber to 500 mm is recommended. But the choice of the material to be deposited and the length by which the evaporators protrude into the side chamber are also important. Our optimization was done with evaporators protruding 80 mm into the side chamber. If the depth of the side chamber is chosen too profound, deeper than 800 mm the beneficial effect of the invention is lost. The fraction of atoms reaching the workpieces on a straight path from the target becomes too small. The width of the rectangular connection should according to this invention be determined by the angle of aperture. The angle of aperture is the angle of intersection of two planes that are defined as follows: Each of them passes through the axis of symmetry of the main chamber and one of the two cylinder generators that are common to the main chamber and the side chamber. In the case of a prismatic or rectangular main chamber, an analogous definition applies. The considerations determining this angle of aperture are similar to the ones that have lead to the determinations of upper and lower limits for the depth. The determining feature for the upper and lower limits of the angle of aperture $\alpha$, is the shape and extension of the target surfaces or more specifically the projection of the target surfaces on the plane of intersection of the main chamber with the side chamber. Through practical experiments we found that this angle must be limited between $\pi/10$ and $\pi/3$ to achieve satisfactory results. In a further preferred but not exclusive embodiment the wall parallel to the plane of intersection of main chamber and side chamber is formed by a door linked to the side chamber by a vacuum fitting and seals. This makes maintenance much more easy, still more easy, if the door carries the evaporators.

The evaporator according to this invention is of a much simpler design than the evaporators of the state of the art. This is not only an advantage with respect to cost, it also improved reliability significantly. The evaporator according to this invention consists of a rotationally symmetric pot, whose side not facing the workpieces, called the back side, is connected to the wall of the side chamber by a vacuum connection. Details of this vacuum connection can be found in the description of the state of the art of the mechanical construction of vacuum chambers. The front side of the pot is closed vacuum tight by a cooling body. A disc of material to be evaporated is fixed on the front side of the cooling body. The surface of this disc facing the workpieces is called the target surface. The other circular face of the target is called the target back side. The inside of the pot contains a rotationally symmetric device, that produces permanently a magnetic field. The magnetic field is not rotationally symmetric. This magnetic field producing device rotates around the evaporator axis, which is also the axis of symmetry of the pot an the magnetic field producing device. The evaporator is further equipped with two concentric electrical leads. These concentric electrical leads are a significant improvement over the state of the art design of leads as described in DE 4109213: The disposition is simpler. A double walled pot is not necessary any more. The use of a magnetic field, that is not rotationally symmetric opens the possibility to increase the distance between the target surface and the magnetic field producing device. The present invention positions the cooling body between the magretic field producing device and the target. This produces a significantly better cooling of the target, which affects positively the phase distribution of the material ejected from the cathode spot. A further improvement is realized by the use of two concentric electrical leads. It was shown already in EP 492 592, that one should use several electrical leads in the case of rectangular targets. It is surprising that these reasons are also valid for circular targets. But the concentric disposition solves the problems of the linear disposition of EP 492592. The concentric disposition makes shielding straightforward and therefore allows the evaporator to meet the legal regulations on electromagnetic compatibility of machines introduced recently. In a further improvement over -the state of the art the preferred embodiment of the evaporator is not a device operating with a steered cathode spot arc, but uses magnetic fields based on a different design principle. The magnetic field of the preferred embodiment is not necessarily of a form such that the section where the component of the field in the target plane has a maximum forms a closed loop. The magnetic field is such, that the field vector is essentially parallel to the target plane over the largest portion that can be realized. This type of field will exert a force on the cathode spot, inducing a jump to the next position on the entire target surface. In contrast to the steered arc no preferred direction of the spot is aimed for. The only thing that matters is the jumping frequency. One might call this the "chased arc" principle. The rotation of the non rotationally symmetric magnetic field enhances this chasing effect by creating on the whole target surface a fluctuating magnetic field, whose vector essentially parallels the target surface. The cathode spot or the cathode spots are chased relentlessly unable to ever find a point of rest. This also solves the target erosion uniformity problem.

In a further improvement of the invention the magnetic field producing device is put into a rapid rotation of at least 50 revolutions/minute or in the preferred realization of at least 500 revolutions/minute. This fast rotation further improves the coating quality. The state of the art as described in EP 283095 had used a slow double rotation, which was appropriate for the steered cathode spot arc. The chased cathode spot arc leads ever better results, the more relentlessly it is chased, i. e., the faster the magnetic field producing device rotates.

I also succeeded to improve significantly on other aspects of the realization. The concentric electric leads are advantageously realized as two copper pipes of twin use: as water ducts and as electric current leads. Since the magnetic field producing device is not under vacuum its axis can be linked to well lubricated roller bearings which connect it either to the cathode pot or the side chamber wall. This is turn is a prerequisite for the high speed rotation of the magnetic field producing device. In particular and as a further preferred realization, for which we also claim protection the magnetic field producing device is constructed in a way, that without rotation the magnetic field is of such shape, that all or most of its lines pierce the target surface only once meaning they only enter or exit the target surface. The return to the counter-pole occurs after entering or exiting the cylindrical surface of the target or the cooling body surface or the cathode pot surface. A magnetic field, that satisfies these criteria can be made in many different ways from permanently magnetic material and ferromagnetic or ferrimagnetic yokes. A priori they all are acceptable realizations of the invention. If the mechanical stability of such a construction is insufficient to withstand the centrifugal forces of the fast rotation, the magnetic materials can be embedded into a structure of diamagnetic material, e.g. a Polymer. In a preferred embodiment the permanent magnets are arranged in a way that one pole face is either parallel to the target surface or under a particular angle or particular angles. All magnetic field lines entering or exiting the target surface will enter respectively exit this pole face. This pole is in an eccentric position with respect to the rotational axis. The counter-pole or the counter-poles are disposed on a circle whose center is the axis of rotation. But the pole faces of the counter-poles are not allowed to be parallel to the target surface. The surface normals of the counter-pole faces will therefore form an angle $\beta_i$ with the target surface. Be $\beta$ the weighted average of the $\beta_i$ s. A simple although not the preferred realization of this is of course the case where all surface normals of the counter-poles form the same angle $\beta$. We found, that in order to assure a stable operation of the chased arc and a uniform target erosion, $\beta$ must not be smaller than $\pi/20$ and not exceed $4\pi/5$. Note that $\beta=0$ is a condition for the magnetic field producing devices of the state of the art corresponding to the steered cathode spot arc.

The apparatus allows the production of coatings of significantly improved quality with evaporators described in the state of the art.

The evaporator allows the production of novel coatings with better performance when incorporated in a state of the art coating apparatus.

The operation of the evaporator of this invention in the apparatus subject of this invention can be further improved. The improvements relate to the operational stability and the quality of the coatings produced in the apparatus with the help of the evaporator.

It was found, that a further improvement can be achieved, if one uses two round evaporators of the type subject of this invention. This finding further evidences the big difference between the apparatus of this invention and the state of the art. The state of the art recommends the use of rectangular evaporators or spiral dispositions of round evaporators.

The electrical potential of the side chamber wall is also relevant for the mutual fractions of atoms and ions of the evaporated component of the material that will form the coating. We found, that optimal conditions prevail, if the side chamber carries a lining, that is electrically insulated A further improvement is achieved if auxiliary anodes are placed in the space connecting the main chamber to the side chamber. The use of anodes called auxiliary anodes other than the chamber wall proposed originally by Sablev et al. is known in the state of the art. The splitting of the plasma current between the auxiliary anodes and the chamber wall is also part of the state of the art. The auxiliary anodes of the state of the art are either concentric with the target surface or they are formed into a ring in front of the target surface like,in EP 511153. To place them in or close to the space connecting the main chamber with the side chamber is a novel disposition. It allows for a reduction of the ionic fraction of the material forming the coating. This reduction of the ion zed fraction reduces the internal stresses in the coating which are particularly damaging in the state of the art coating of cemented carbide tools with titanium carbonitride.

To our surprise we found also, that optimum conditions for the deposition of wear resistant coatings prevail whenever the angle of aperture a of the apparatus coincides or is close to the angie $\beta$, formed between the counter-poles and the axis of rotation of the magnetic field producing device of the evaporator. I believe I can explain this by the fact, that the magnetic field leads to the formation of a conical plasma beam, that fits well in the aperture of the main chamber, when the angles a and $\beta$ are similar.

BRIEF DESCRIPTION OF THE DRAWINGS

The way to construct an apparatus and an evaporator according to the invention can be learned from the preferred embodiment shown in the enclosed drawings.

Drawings 1 and 2 show two views of an apparatus according to the invention.

Figure 1:
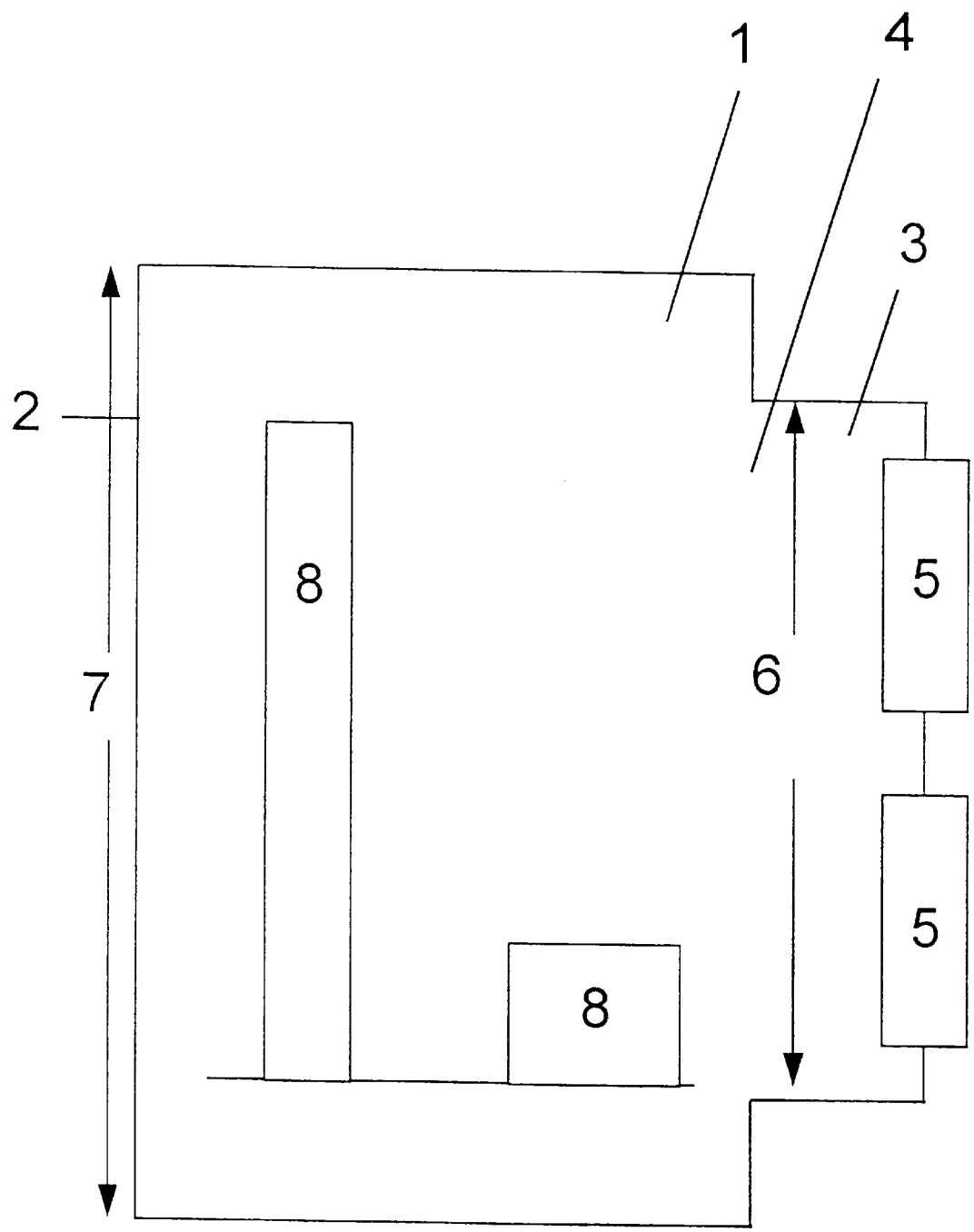
Figure 2:
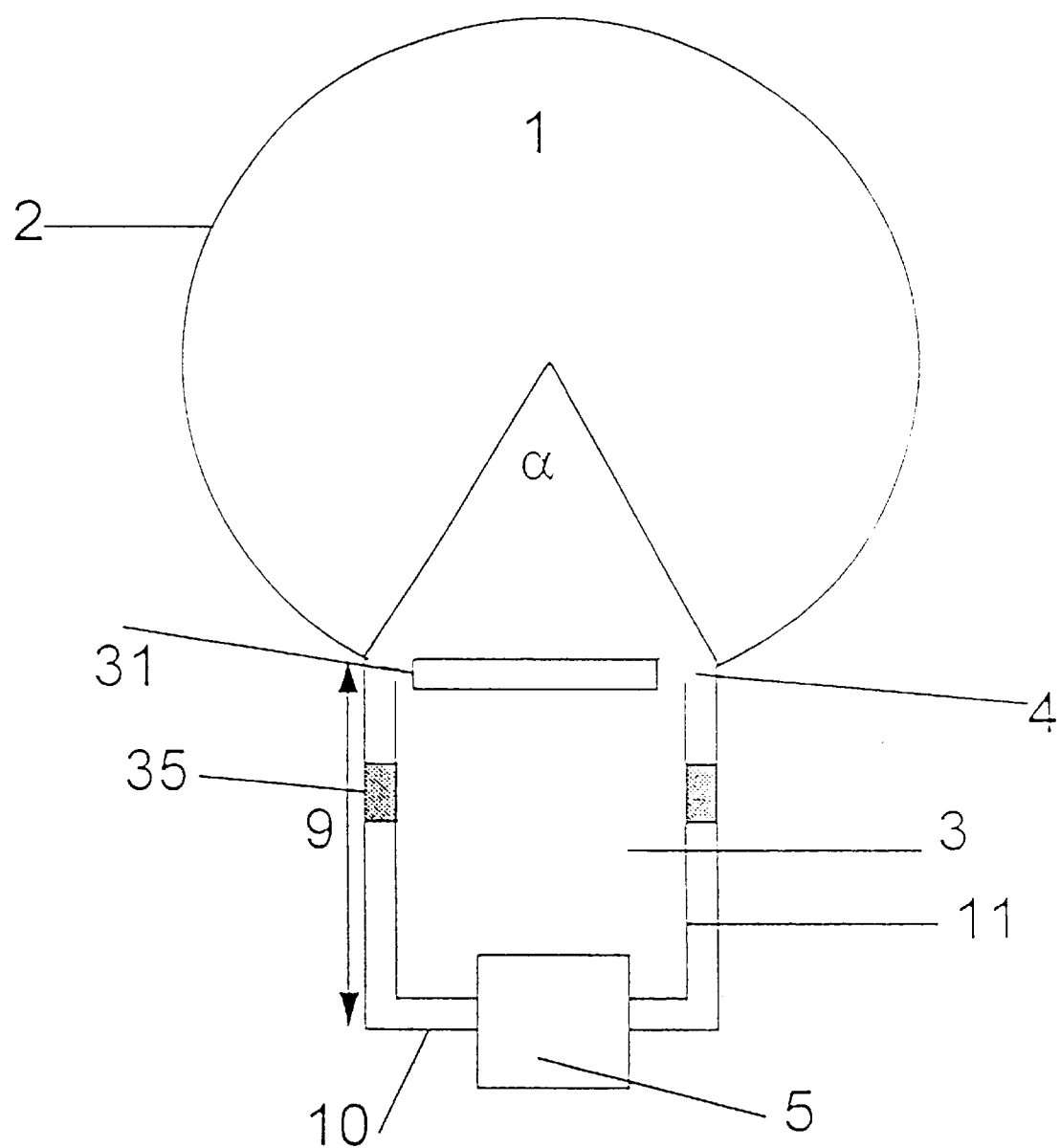
Figure 3:
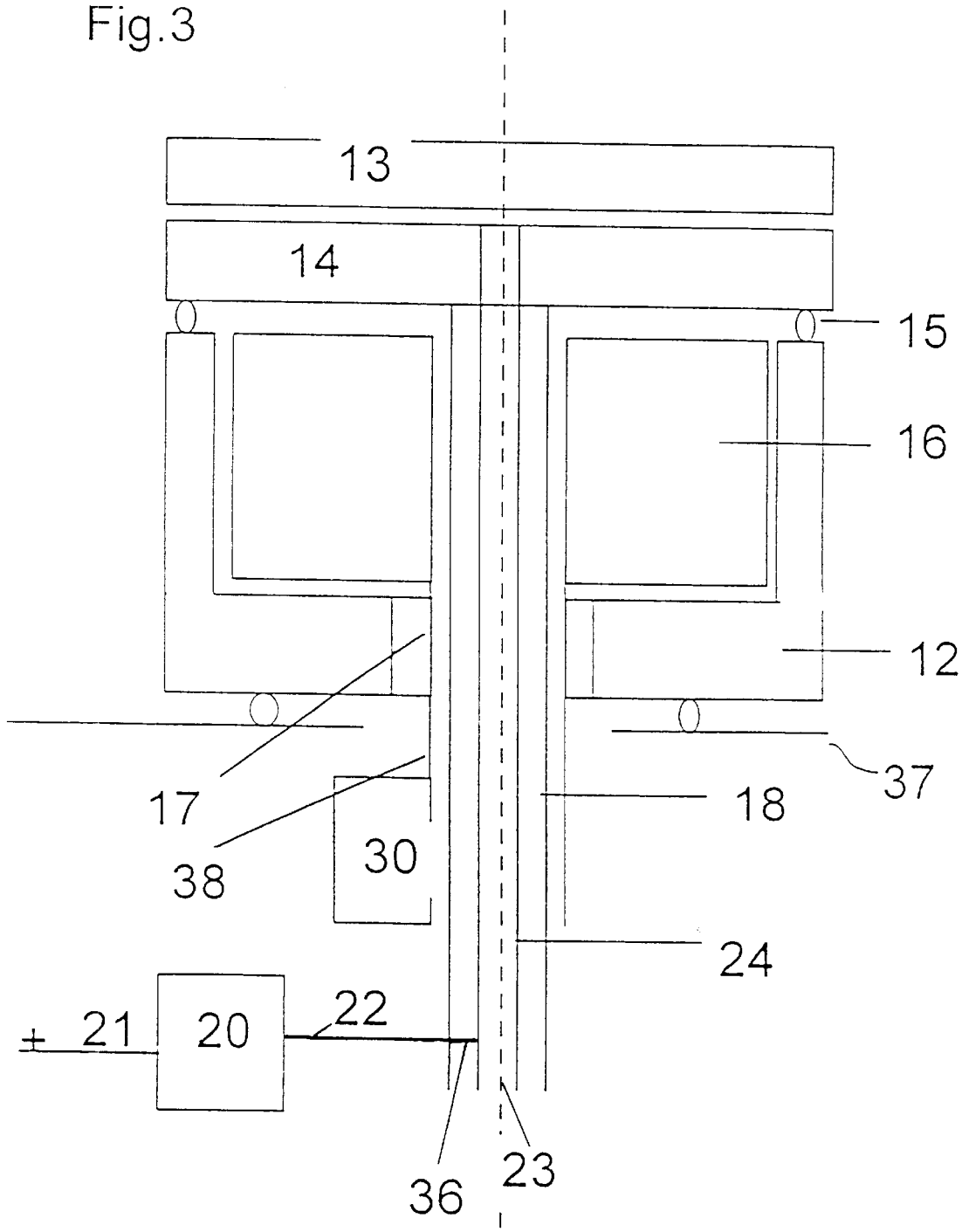
Figure 4:
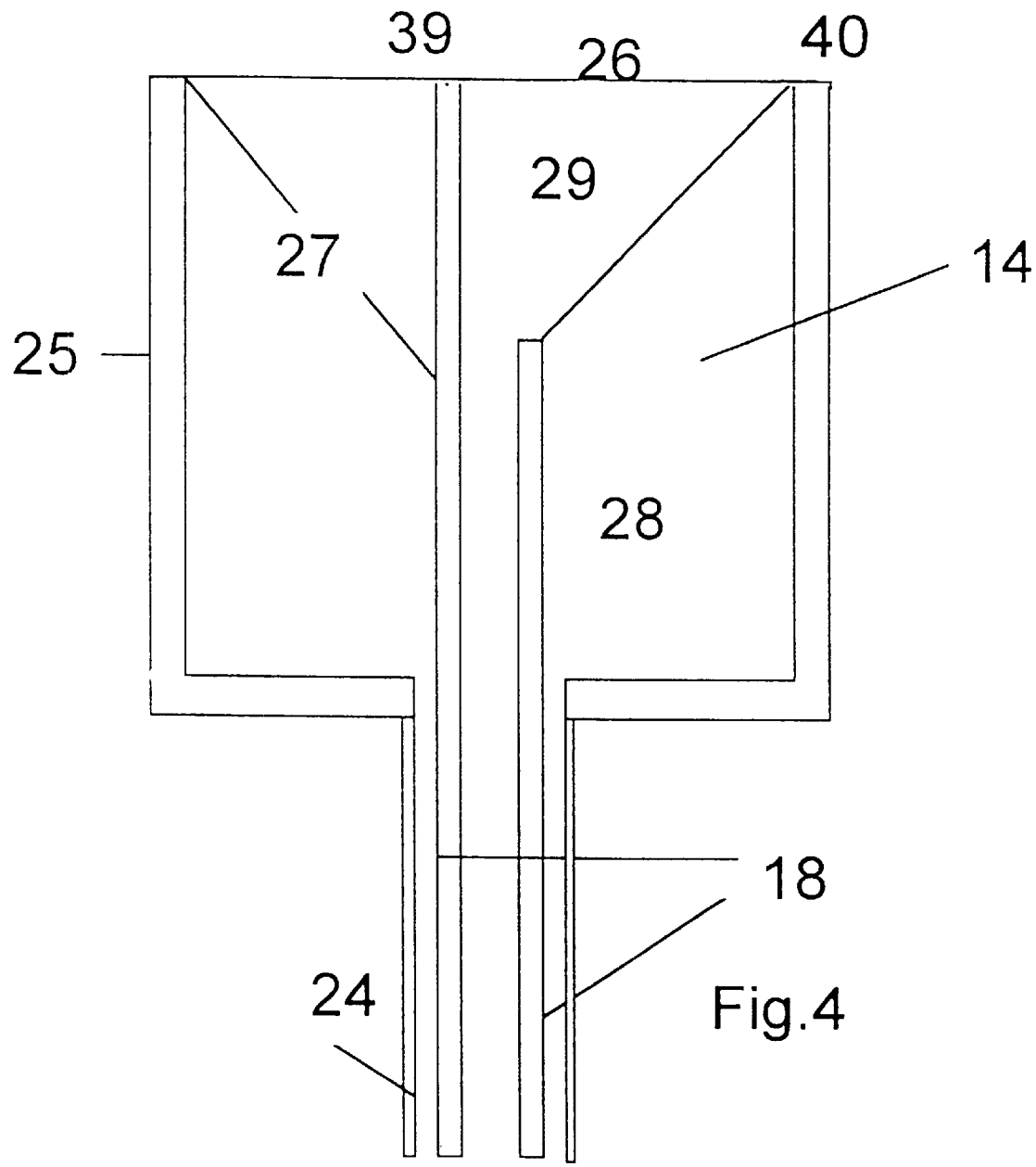
Figure 5:
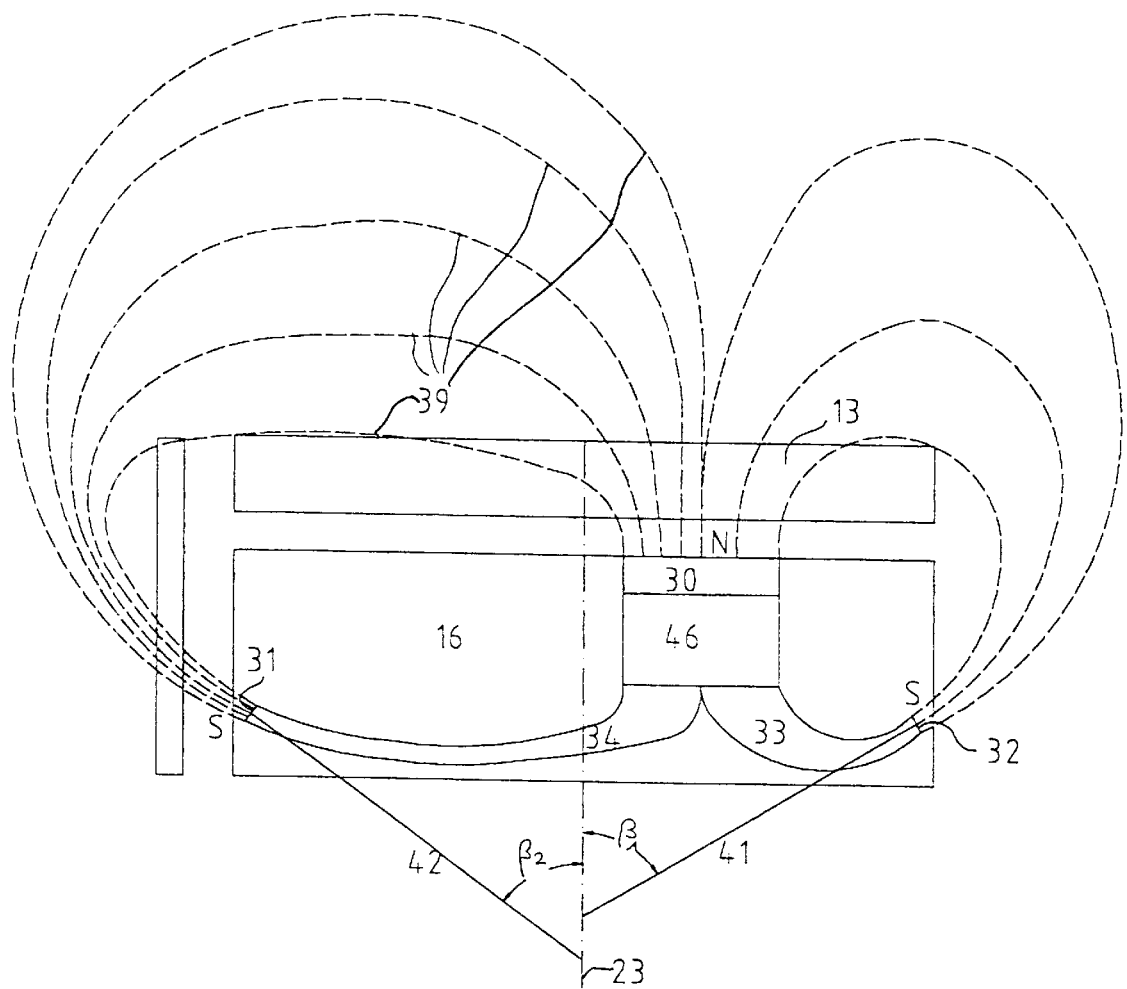
Figure 6A:
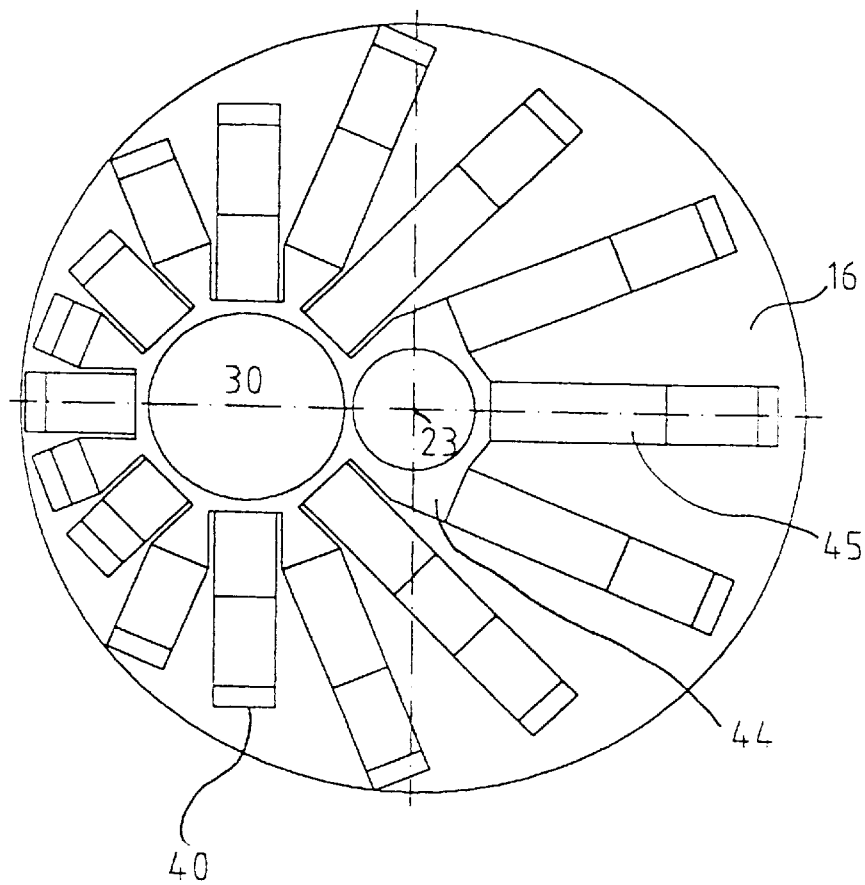
Figure 6B:
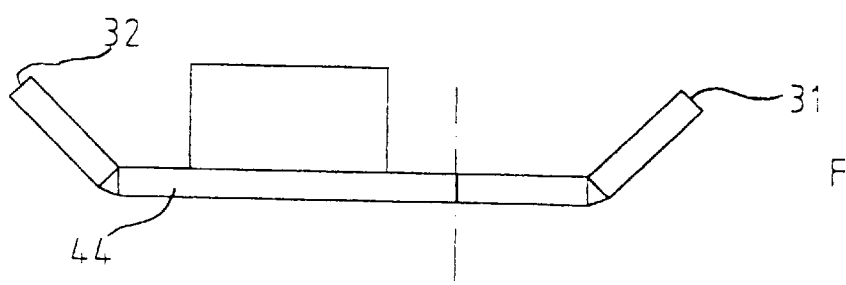
Figure 6C:
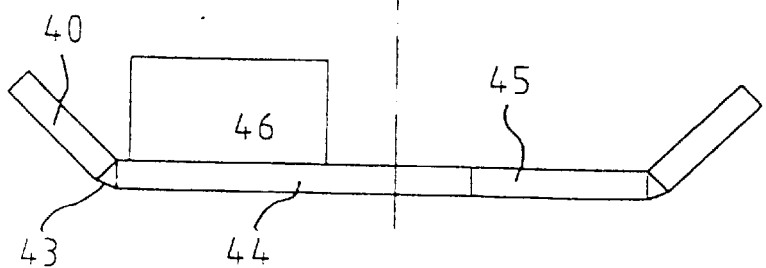

Drawing 3 shows the construction of the evaporator according to the invention Drawing 4 is a drawing of the cooling body.

Drawing 5 shows a realization of the magnetic field producing device.

Drawings 6a, 6b, 6c shows another realization of the magnetic field producing device.

DESCRIPTION OF THE PREFERRED EMBODIMENT OF THE INVENTION

Drawing 1 shows an apparatus for the plasma assisted physical vapor deposition on workpieces consisting of a main chamber (1) and a side chamber (3). Main Chamber and side chamber are connected by the port (4) in such a way, that a molecular flow is not impeded. The main chamber contains the workpieces (8) to be coated. The side chamber contains two evaporators (5). Irrelevant details of the apparatus whose necessity, design and disposition is known to anybody skilled in the art like pumps, gas feeding ducts substrate drive mechanisms and conditioning devices have not been included in the drawing. The drawing also shows the length of the cylinder (2) and the length (6) of the rectangular port (4) connecting the main chamber to the side chamber.

Drawing 2 shows in addition to the elements displayed in drawing I the angle of aperture a that defines the width of the intersection between the main chamber and the side chamber and the depth (9) of the side chamber (3). The evaporators (5) are mounted onto a door (10), which is parallel to the port (4). The side chamber carries a lining (11), which is electrically insulated from the side chamber wall, the main chamber wall (2) and the door (10) by insulating elements (35). In the space between main chamber and side chamber two auxiliary anodes (31) have been mounted. They are essentially two flats of copper, whose length correspond roughly to the width of the port (4). They are of course shorter by a length that safely avoids electrical contact. There width can range from 5 to 20 mm. They are welded onto a water cooled copper pipe, which also serves as electrical current lead. Water and electrical current are lead outside the chamber wall by a feed through not shown, since its design is well known to anybody skilled in the art.

Drawing 3 shows the features of the mechanical construction of the evaporator, that characterize the invention. Its design is rotationally symmetric with a symmetry axis (23).

Details with which the man skilled in the art is familiar like screws, seals and feed-throughs are again are only shown, if they have a function characterizing the invention or if particular aspects, which do not correspond to standard design have to be taken into account. U.S. Pat. No. 4622452 gives a description of a state of the art evaporator that contains all possible details and may serve as a reference. The evaporator comprises a disc (13) of the material to be evaporated to form one of the components of the coating. This is the target. It is solidly connected to the cooling body (14) backing it. This solid connection can be achieved either by screws or prawns on the border of the disc, by a threaded bolt in the center of the backside or by a cap nut. All these solutions have been described in the state of the art. The connection is not vacuum tight. The cooling body backing the target has been manufactured from copper. Its details are shown in drawing 4. Two concentric copper pipes (18) and (24) lead into the interior of the cooling body. (24) is the water supply pipe, (18) is the water drain pipe. The two pipes are linked electrically to each other by copper bridges (36) and by the cable (22) with the negative terminal of a suitable dc power supply (20). The positive terminal of the power supply is connected by a cable (21) and a current spliter to the auxiliary anodes and the wall of the main chamber. The cooling body is mechanically stiff and connected to the cathode pot (12). This connection is vacuum tight it is equipped with seals (15). The cathode pot can be manufactured from any material that is not ferromagnetic and vacuum compatible like 304 type stainless steel, Inconel, aluminum or copper. This cathode pot is connected in a way that ensures mechanical stiffness and by seals with the side chamber wall respectively the side chamber door (37). This can be achieved by screws or prawns, preferably in a way that corresponds to the ISO-specifications for vacuum technology. The pot contains the magnetic field producing device (16), whose details are shown in drawings 5 and 6. The magnetic field producing device is connected to the pot by an axis (38) and a ball bearing (17) suitable for high speed rotation. The axis is driven by a motor (30). Drawing 4 shows a preferred embodiment of the cooling body. It consists of a copper pot (25), whose front face is closed by a thin copper foil (26) brazed onto it. The interior of the body is split into an upper chamber (29) and a lower chamber (28) by a separating wall (27). The center of the side opposing the target has a hole connected to the feed pipe (24). The feed pipe will first fill the lower chamber. By a triangular opening in the separating wall the water will flow on into the upper chamber (29) before it leaves by the drain pipe (18). The center (39) of the copper foil (26) is electrically connected to the drain pipe (18). The feed pipe (24) leads the electrical current to the pot (25) into a section (40), which corresponds roughly to the contact area between foil and pot. Section (40) connects to the border zone of the target. The wall thickness of the pipes and the pot must be chosen in such a way, that the electrical resistance of the two paths of the electrical current, the one formed by the drain pipe and the one originating from the feed pipe are approximately equal. Approximately equal means that there dc resistance should not differ by more than 0,2Ω.

Drawing 5 shows an embodiment of the magnetic field according to the invention. A cylinder (46) made from the permanently magnetic alloy Nd—Fe—B was inserted into a disc (16) made from polyethylene. The cylinder can form an angle with the rotational axis of the magnetic field producing device. The magnet contacts a yoke (30) whose upper side forms the north pole of the magnetic field producing device. The back of the cylinder (46) is connected to a spider shaped yoke with long legs (34) and short legs (33) made from a soft ferromagnetic material like soft iron or a suitable nickel alloy, which conducts the induction flow to the counter-poles (31) and (32). They form the south pole of the magnetic field producing device. All south pole faces lie on a circle concentric to the symmetry axis (23) of the target. The surface normals (42) and (41) of the different legs form angles $\beta_1$ and $\beta_2$ with the rotational axis (23). North and south poles are linked by the magnetic field lines (39). In the embodiment shown all magnetic field lines will exit from the magnetic field producing device on the north pole. Therefore they are essentially parallel to the rotational axis (23). They will al exit the target plate after having penetrated it. On the south-poles they will enter again essentially normal to the pole faces (31) and (32), i. e. parallel to the surface normals (40 and (42). This entering takes place after they have penetrated in essentially all cases the cylinder jackets of one of the three elements (12), (13) or (14).

Drawing 6 shows another embodiment of the invention. The top view 6a shows the north pole (30) consisting of a soft iron yoke. Below it, there is again a cylinder made from the permanently magnetized alloy neodymium-iron-boron. This cylinder sits on a plate made from soft iron (44). Rectangular parallelepiped bits (45) of permanently magnetized material connect to some portions of this soft iron plate thereby forming an asymmetric star. Further rectangular parallelepiped bits of permanently magnetized material (40) are connected to the first bits (45) by small yokes (43). The second bits (40) do form a definite angles $\beta_i$ with the first bits (45). Their ends can carry further yokes. This embodiment also produces a magnetic field corresponding to the invention.

What is claimed is:

1. Apparatus for plasma assisted physical vapor deposition of coatings onto workpieces comprising at least one or more cathode spot arc evaporators, the apparatus comprising a main chamber having a wall and a parallelepiped side chamber, the wall of the main chamber having at least one rectangular opening, the at least one rectangular opening of the main chamber being connected to the parallelepiped side chamber along a side of the parallelepiped side chamber by a port, the workpieces being contained exclusively in the main chamber, the main chamber containing no cathode spot arc evaporators and all the evaporators being mounted in the parallelepiped side chamber, the length of the rectangular opening corresponding to at least 60% of height of the main chamber, the depth of the side chamber being a range of 300 to 800 mm, and the at least one rectangular opening of the main chamber corresponding to a cylinder jacket to an angle of aperture $\alpha$ larger than $\pi/10$ but smaller than $\pi/3$.

2. Apparatus according to claim 1 wherein the parallelepiped side chamber includes a lining electrically insulated from the chamber wall and a wall of the side chamber.

3. Apparatus according to claim 2 wherein the parallelepiped side chamber includes at least two rotationally symmetric cathode spot arc evaporators.

4. Apparatus according to claim 3 wherein each of said cathode spot arc evaporators comprises a rotationally symmetric pot connected to a chamber wall of the apparatus, a circular target, made from at least one component of a material that should form the coatings, a vacuum tight water cooling body through which water is flowing located immediately behind the target and a moving magnet field producing device comprising poles and counter-poles having faces located behind the cooling body.

5. Apparatus according to claim 4 wherein the counter-pole faces form an average angle $\beta$ with a rotational axis of the target and the angle $\beta$ exceeds $\pi/20$ and is smaller than $4\pi/5$.

6. Apparatus according to claim 5 wherein the angle β is essentially equal to the angle α.

7. Apparatus according to claim 1 further comprising at least one auxiliary anode mounted in a space immediately adjacent to the connecting port of the main chamber and the side chamber, the anode carrying at least part of an arc current.

8. Cathode spot arc evaporator for an apparatus for plasma assisted physical vapor deposition of coatings onto workpieces comprising at least one cathode spot arc evaporator comprising a rotationally symmetric pot connected to a chamber wall of the apparatus, a circular target, made from at least one component of a material that should form the coating, a vacuum tight water cooling body through which water is flowing located immediately behind the target and a moving magnetic field producing device comprising poles and counter-poles having faces located behind the cooling body, in at least two current leads to the cathode body, the electric current and water feed and drain being carried out at least in part by two concentric copper pipes, one of the pipes being electrically connected to a center portion of the surface adjacent to the target backside and the other pipe being connected with a border portion of the surface adjacent to the target backside of the cooling.

9. Cathode spot arc evaporator for the plasma assisted physical vapor deposition of coatings onto workpieces according to claim 8, wherein electrical resistance of the at least two current leads is approximately equal.

10. Cathode spot arc evaporator according to claim 8 wherein magnetic field lines connecting the poles to the counter-poles of the magnetic field producing device do not penetrate a target surface but in one single point each.

11. Cathode spot arc evaporator according to claim 8 wherein the counter pole faces form an average angle β with a rotational axis of the target and the angle β exceeds $\pi/20$ and is smaller than $4\pi/5$.

* * * * *